United States Patent
Huang et al.

(10) Patent No.: US 8,643,005 B2
(45) Date of Patent: Feb. 4, 2014

(54) ORGANIC LIGHT EMITTING DISPLAY DEVICE AND METHOD FOR MANUFACTURING THE SAME

(75) Inventors: Sung-Hui Huang, Hsinchu (TW); Wei-Chou Lan, Hsinchu (TW); Chia-Chun Yeh, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 415 days.

(21) Appl. No.: 12/949,321

(22) Filed: Nov. 18, 2010

(65) Prior Publication Data

US 2012/0068172 A1  Mar. 22, 2012

(30) Foreign Application Priority Data

Sep. 17, 2010  (TW) .................. 99131682 A

(51) Int. Cl.
  *H01L 33/18* (2010.01)
  *H01L 21/4757* (2006.01)

(52) U.S. Cl.
  USPC ............ 257/43; 257/E33.02; 257/E21.49

(58) Field of Classification Search
  USPC ............................................. 257/43
  See application file for complete search history.

(56) References Cited

U.S. PATENT DOCUMENTS

| 2004/0032206 A1 | 2/2004 | Weaver et al. |
| 2009/0146930 A1 | 6/2009 | Nishimura et al. |
| 2009/0239335 A1* | 9/2009 | Akimoto et al. ............. 438/104 |

FOREIGN PATENT DOCUMENTS

CN  101079473  11/2007

* cited by examiner

*Primary Examiner* — Matthew W Such
*Assistant Examiner* — Robert Carpenter
(74) *Attorney, Agent, or Firm* — WPAT, PC; Justin King

(57) ABSTRACT

An organic light emitting display device includes a substrate, a transparent electrode layer, a source/drain layer, an IGZO semiconductor layer, a first insulating layer, a gate layer, a second insulating layer and an organic light emitting diode. The organic light-emitting display device can have a simplified manufacturing process. In addition, the present invention also provides a method for manufacturing the organic light-emitting display device.

9 Claims, 6 Drawing Sheets

ORGANIC LIGHT EMITTING DISPLAY DEVICE AND METHOD FOR MANUFACTURING THE SAME

This application claims the right of priority based on Taiwan Patent Application No. 099131682 entitled "Organic Light Emitting Display Device and Method for Manufacturing the Same", filed on Sep. 17, 2010, which is incorporated herein by reference and assigned to the assignee herein.

FIELD OF THE INVENTION

The present invention relates to a display device and a method for manufacturing the display device, and more particularly to an organic light emitting display device and a method for manufacturing the organic light emitting display device.

BACKGROUND OF THE INVENTION

Organic light emitting display devices use light of organic light emitting diodes to produce images. The organic light emitting diodes are arranged in a matrix manner in the organic light emitting display device. For driving the organic light emitting diodes to produce the images, methods currently in use can be classified into two types of a passive matrix type and an active matrix type. The active matrix type can satisfy the requirement of large size or high-resolution display more appropriately.

The organic light emitting display device is driven by the use of thin film transistors. Each pixel structure in the organic light emitting display device can include at least two thin film transistors and a storage capacitor.

Generally, the thin film transistor includes a substrate, and a transparent conductive layer, a metal gate layer, a gate insulating layer, an amorphous silicon (a-Si) layer, a source/drain layer, a protective layer and a pixel electrode sequentially formed on the substrate.

However, if the organic light emitting display device is made by using the above thin film transistors, and after the thin film transistors are formed, one step for forming a pixel defined layer should be added for filling organic material. That would make the process of manufacturing the organic light emitting display device become relatively more complicated, and thus production rate of the organic light emitting display device would be reduced.

What is needed, therefore, is a new organic light emitting display device and method for manufacturing the organic light emitting display device that can simplify manufacturing process and enhance production rate.

SUMMARY OF THE INVENTION

Therefore, the object of the present invention is to provide an organic light emitting display device, which can have a simplified manufacturing process.

Another object of the present invention is to provide a method for manufacturing an organic light emitting display device, which can simplify manufacturing process and enhance production rate.

The present invention provides an organic light emitting display device, which includes a substrate, a transparent electrode layer, a source/drain layer, an IGZO semiconductor layer, a first insulating layer, a gate layer, a second insulating layer and an organic light emitting diode. The substrate has a first thin film transistor region, a second thin film transistor region and an organic light emitting region, the second thin film transistor region located between the first thin film transistor region and the organic light emitting region. The transparent electrode layer is disposed on the substrate, and includes a first electrode, a second electrode and a third electrode, the first electrode located above the first thin film transistor region, the second electrode located above the second thin film transistor region, the third electrode located above the organic light emitting region and electrically connected with the second electrode. The source/drain layer is disposed on the transparent electrode layer, and includes a first drain and a second drain, the first drain located above the first thin film transistor region, the second drain located above the second thin film transistor region. The IGZO semiconductor layer is disposed on the source/drain layer and the substrate, and includes a first semiconductor and a second semiconductor, the first semiconductor located above the first thin film transistor region, the second semiconductor located above the second thin film transistor region. The first insulating layer is disposed on the source/drain layer, the IGZO semiconductor layer and the substrate, and exposing the third electrode. The gate layer is disposed on the first insulating layer, and includes a first gate and a second gate, the first gate located above the first thin film transistor region, the second gate located above the second thin film transistor region, extended to above the first thin film transistor region and electrically connected with the first drain. The second insulating layer is disposed on the first insulating layer and the gate layer, and exposes the third electrode. The organic light emitting diode is disposed on the third electrode.

The present invention also provides a method for manufacturing an organic light emitting display device, which includes the following steps. First, a substrate is formed, which has a first thin film transistor region, a second thin film transistor region and an organic light emitting region, the second thin film transistor region located between the first thin film transistor region and the organic light emitting region. Next, a transparent electrode layer is formed on the substrate, the transparent electrode layer including a first electrode, a second electrode and a third electrode, the first electrode located above the first thin film transistor region, the second electrode located above the second thin film transistor region, the third electrode located above the organic light emitting region and electrically connected with the second electrode. Next, a source/drain layer is formed on the transparent electrode layer, the source/drain layer including a first drain and a second drain, the first drain located above the first thin film transistor region, the second drain located above the second thin film transistor region. Next, an IGZO semiconductor layer is formed on the source/drain layer and the substrate, the IGZO semiconductor layer including a first semiconductor and a second semiconductor, the first semiconductor located above the first thin film transistor region, the second semiconductor located above the second thin film transistor region. Next, a first insulating layer is formed on the source/drain layer, the IGZO semiconductor layer and the substrate. Next, a gate layer is formed on the first insulating layer, the gate layer including a first gate and a second gate, the first gate located above the first thin film transistor region, the second gate located above the second thin film transistor region, extended to above the first thin film transistor region and electrically connected with the first drain. Next, a second insulating layer is formed on the first insulating layer and the gate layer. Next, an opening is defined in the first insulating layer and the second insulating layer, the opening exposing the third electrode. Finally, an organic light emitting diode is formed on the third electrode.

In the organic light emitting display device and the method for manufacturing the same, the organic light emitting diode is configured on a side of the thin film transistor, therefore some steps of using the mask can be reduced. As such the manufacturing process of the organic light emitting display device can be simplified.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
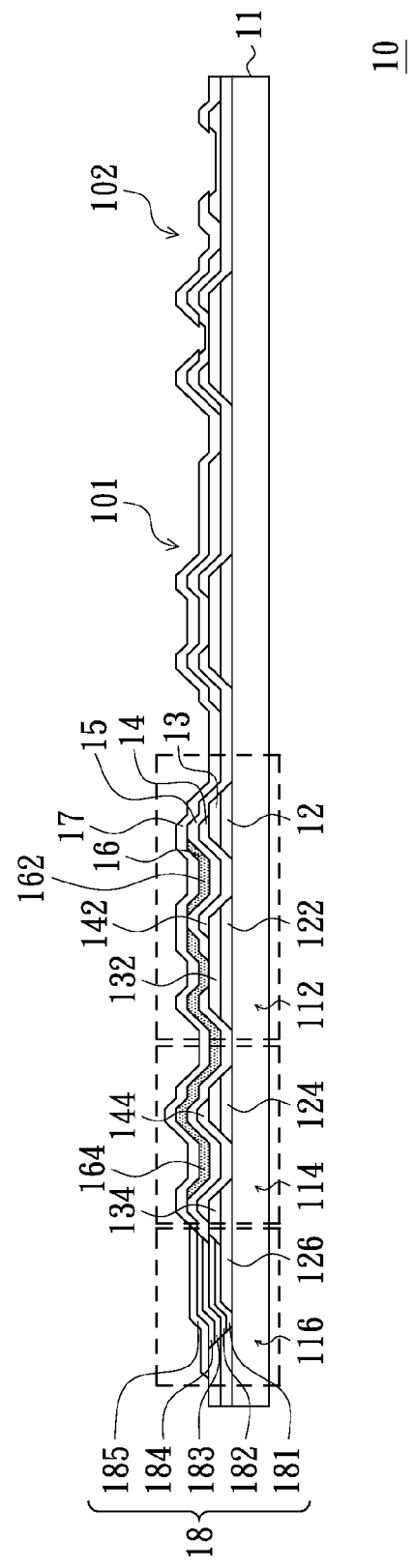
FIG. 1 is a schematic, cross-sectional view of an organic light emitting display device according to an exemplary embodiment of the present invention.

FIG. 1 is a schematic, cross-sectional view of an organic light emitting display device according to an exemplary embodiment of the present invention. Referring to FIG. 1, the organic light emitting display device 10 includes a substrate 11, a transparent electrode layer 12, a source/drain layer 13, an indium gallium zinc oxide (IGZO) semiconductor layer 14, a first insulating layer 15, a gate layer 16, a second insulating layer 17 and an organic light emitting diode 18.

The substrate 11 has a first thin film transistor region 112, a second thin film transistor region 114 and an organic light emitting region 116. The second thin film transistor region 114 is located between the first thin film transistor region 112 and the organic light emitting region 116.

The transparent electrode layer 12 is disposed on the substrate 11. The transparent electrode layer 12 includes a first electrode 122, a second electrode 124 and a third electrode 126. The first electrode 122 is located above the first thin film transistor region 112. The second electrode 124 is located above the second thin film transistor region 114. The third electrode 126 is located above the organic light emitting region 116 and electrically connected with the second electrode 124.

The source/drain layer 13 is disposed on the transparent electrode layer 12. The source/drain layer 13 includes a first drain 132 and a second drain 134. The first drain 132 is located above the first thin film transistor region 112. The second drain 134 is located above the second thin film transistor region 114.

The IGZO semiconductor layer 14 is disposed on the source/drain layer 13 and the substrate 11. The IGZO semiconductor layer 14 includes a first semiconductor 142 and a second semiconductor 144. The first semiconductor 142 is located above the first thin film transistor region 112. The second semiconductor 144 is located above the second thin film transistor region 114.

The first insulating layer 15 is disposed on the source/drain layer 13, the IGZO semiconductor layer 14 and the substrate 11. The first insulating layer 15 exposes the third electrode 126. In the embodiment, the first insulating layer 15 completely exposes an end of the third electrode 126 away from the second electrode 124. In other embodiments, the first insulating layer 15 can partially expose the end of the third electrode 126 away from the second electrode 124, and that is a portion of the first insulating layer 15 can be located above the end of the third electrode 126 away from the second electrode 124.

The gate layer 16 is disposed on the first insulating layer 15. The gate layer 16 includes a first gate 162 and a second gate 164. The first gate 162 is located above the first thin film transistor region 112. The second gate 164 is located above the second thin film transistor region 114. The second gate 164 is extended to above the first thin film transistor region 112 and electrically connected with the first drain 132.

The second insulating layer 17 is disposed on the first insulating layer 15 and the gate layer 16. The second insulating layer 17 exposes the third electrode 126. The first insulating layer 15 and the second insulating layer 17 can be used as a pixel defining layer of the organic light emitting diode 18.

The organic light emitting diode 18 is disposed on the third electrode 126. The organic light emitting diode 18 can include a hole injection layer 181, a hole transport layer 182, an organic light emitting layer 183, an electron injection layer 184 and a cathode reflective layer 185 sequentially formed on the third electrode 126.

In addition, in the embodiment, the organic light emitting display device 10 can further include a jumper portion 101 and a welding pad portion 102. The jumper portion 101 is connected between the welding pad portion 102 and the first thin film transistor region 112. The welding pad portion 102 can be used to electrically connect to other electrical elements, such as an external circuit board or a control circuit.

In the organic light emitting display device 10, the organic light emitting diode 18 is configured on a side of the thin film transistor, therefore some steps of using the mask can be reduced, and an additional pixel defining layer can be omitted. As such the manufacturing process of the organic light emitting display device 10 can be simplified. In addition, in the organic light emitting display device 10, the IGZO semiconductor layer 14 is used replace the amorphous silicon layer used in the conventional organic light emitting display device. Consequently, an additional light shading layer can be omitted, and thus the manufacturing process of the organic light emitting display device 10 can be further simplified and productive efficiency of the organic light emitting display device 10 can be improved effectively.

Combined with the figures, methods for manufacturing organic light emitting display devices according to exemplary embodiments of the present invention would be described as follows.

Figure 2A:
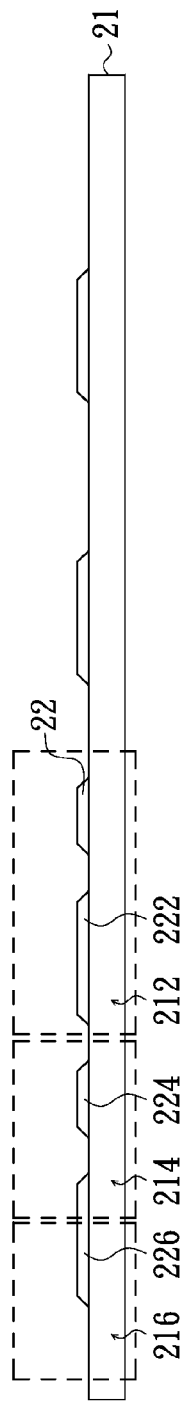
FIGS. 2A-2H are cross-sectional, schematic views of an organic light emitting display device in some steps of manufacturing process according to another exemplary embodiment of the present invention.

Referring to FIG. 2A, in a method for manufacturing an organic light emitting display device, a substrate 21 is formed firstly, and then a transparent electrode layer 22 is formed on the substrate 21. The substrate 21 has a first thin film transistor region 212, a second thin film transistor region 214 and an organic light emitting region 216. The second thin film transistor region 214 is located between the first thin film transistor region 212 and the organic light emitting region 216. The transparent electrode layer 22 includes a first electrode 222, a second electrode 224 and a third electrode 226. The first electrode 222 is located above the first thin film transistor region 212. The second electrode 224 is located above the second thin film transistor region 214. The third electrode 226 is located above the organic light emitting region 216 and electrically connected with the second electrode 224. In details, the substrate 21 can be made of transparent material. The transparent material can be quartz or glass. Material of the transparent electrode layer 22 can include silicon nitride, silicon oxide, molybdenum, chromium, molybdenum chromium alloy or any suitable combination thereof.

Figure 2B:
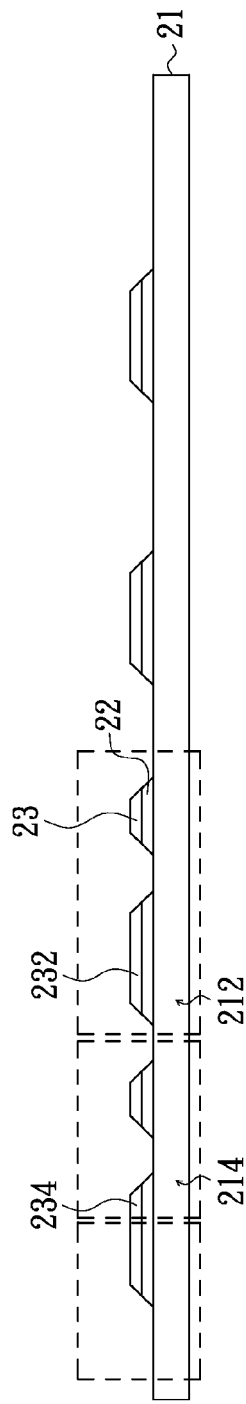

Referring to FIG. 2B, after the transparent electrode layer 22 is formed, a source/drain layer 23 is formed on the transparent electrode layer 22. The source/drain layer 23 includes a first drain 232 and a second drain 234. The first drain 232 is located above the first thin film transistor region 212. The second drain 234 is located above the second thin film transistor region 214. A method of forming the source/drain layer 23 can include the following steps. First, a metal material is deposited on the transparent electrode layer 22, and then the metal material layer is patterned to form the source/drain layer 23. The metal material can include aluminum, aluminum neodymium alloy, molybdenum, chromium, molybdenum chromium alloy, copper or any suitable combination thereof.

Figure 2C:
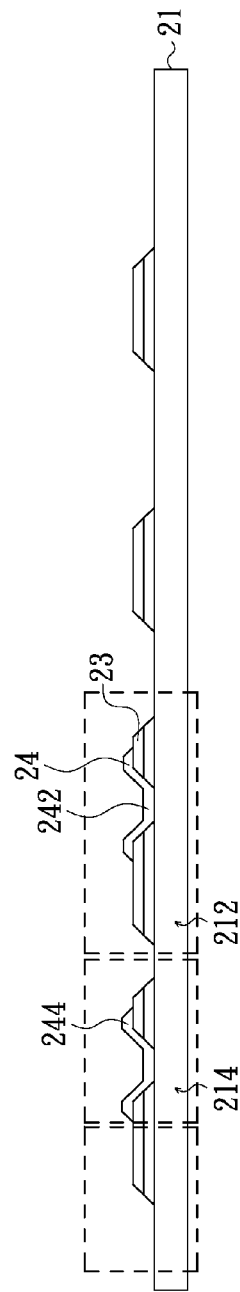

Referring to FIG. 2C, after the source/drain layer 23 is formed, an IGZO semiconductor layer 24 is formed on the source/drain layer 23 and the substrate 21. The IGZO semiconductor layer 24 includes a first semiconductor 242 and a second semiconductor 244. The first semiconductor 242 is located above the first thin film transistor region 212. The second semiconductor 244 is located above the second thin film transistor region 214. A method of forming the IGZO semiconductor layer 24 can include the following steps. First, IGZO semiconductor material is deposited, and then the IGZO semiconductor layer 24 is formed by patterning The IGZO semiconductor material can include amorphous indium gallium zinc oxide.

Figure 2D:
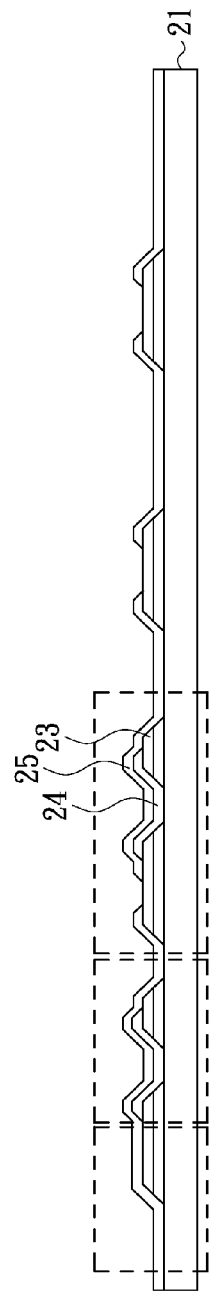

Referring to FIG. 2D, after the IGZO semiconductor layer 24 is formed, a first insulating layer 25 is formed on the source/drain layer 23, the IGZO semiconductor layer 24 and the substrate 21. A method of forming the first insulating layer 25 can include a chemical vapor deposition process and a patterning process. In the chemical vapor deposition process, insulation material is deposited. The insulation material can include silicon nitride, silicon oxide, aluminum oxide, yttrium oxide or any suitable combination thereof.

Figure 2E:
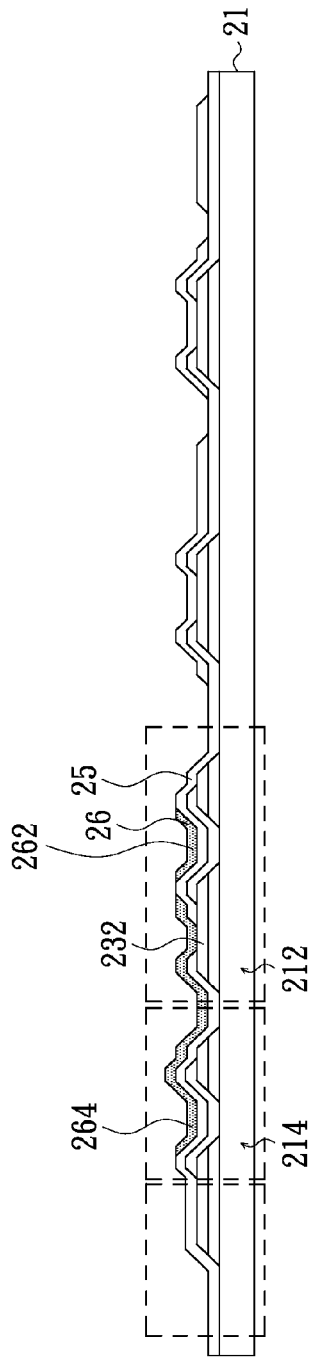

Referring to FIG. 2E, after the first insulating layer 25 is formed, a gate layer 26 is formed on the first insulating layer 25. The gate layer 26 includes a first gate 262 and a second gate 264. The first gate 262 is located above the first thin film transistor region 212. The second gate 264 is located above the second thin film transistor region 214. The second gate 264 is extended to above the first thin film transistor region 212 and electrically connected with the first drain 232. A method of forming the gate layer 26 can include the following steps. First, metal material is deposited, and then the gate layer 26 is formed by patterning The metal material can include aluminum, aluminum neodymium alloy, molybdenum, chromium, molybdenum chromium alloy, copper or any suitable combination thereof.

Figure 2F:
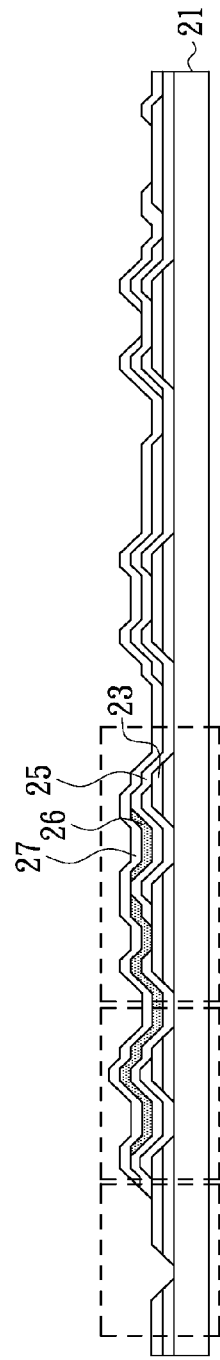

Referring to FIG. 2F, after the gate layer 26 is formed, a second insulating layer 27 is formed on the first insulating layer 25 and the gate layer 26. A method of forming the second insulating layer 27 can include forming an insulating material by a chemical vapor deposition process and then patterning the insulating material by a patterning process. The second insulating layer 27 can include silicon nitride, silicon oxide, phenolic resin or polyimide, or the second insulating layer 27 can be a composite insulation layer including organic material and inorganic material.

Figure 2G:
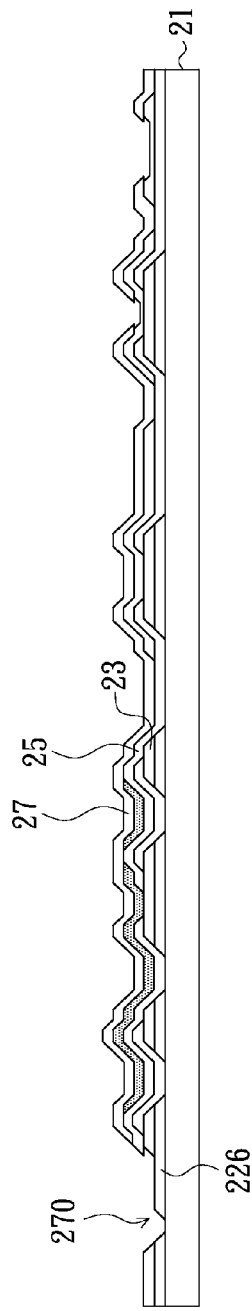

Referring to FIGS. 2F and 2G, after the second insulating layer 27 is formed, an opening 270 is defined in the first insulating layer 25 and the second insulating layer 27. The opening 270 exposes the third electrode 226. In the embodiment, a method of defining the opening 270 can include the steps of etching a portion of the first insulating layer 25 and the second insulating layer 27 to expose a portion of the source/drain layer 23 on the third electrode 226, as shown in FIG. 2F, and then etching the portion of the source/drain layer 23 on the third electrode 226 to expose the third electrode 226, as shown in FIG. 2G. The first insulating layer 25 and the second insulating layer 27 can be used as a pixel defining layer of the organic light emitting diode.

Figure 2H:
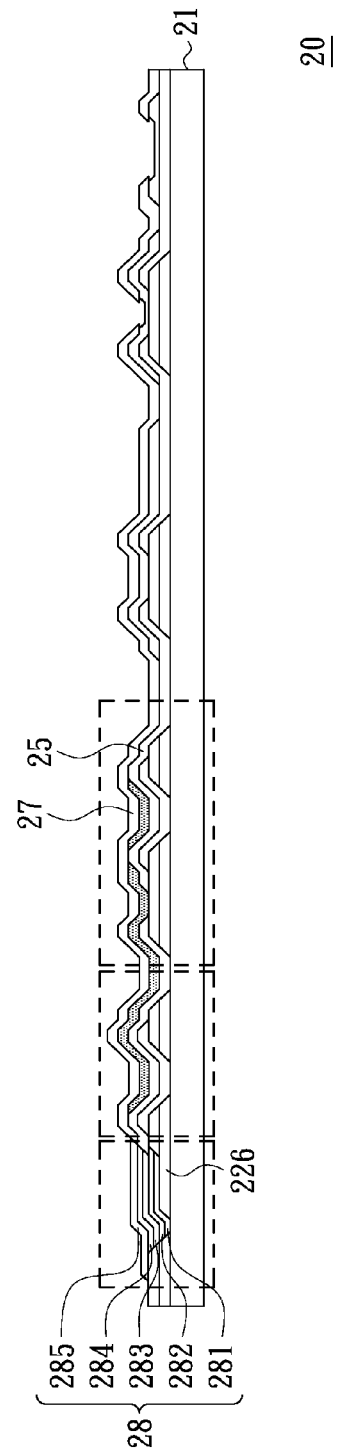

Finally, referring to FIG. 2H, an organic light emitting diode 28 is formed on the third electrode 226, and thus the organic light emitting display device 20 is formed. The organic light emitting diode 28 can include a hole injection layer 281, a hole transport layer 282, an organic light emitting layer 283, an electron injection layer 284 and a cathode reflective layer 285 sequentially formed on the third electrode 226.

In the method for manufacturing the organic light emitting display device 20, the organic light emitting diode 28 is formed on a side of the thin film transistor, therefore some steps of using the mask can be reduced, and an additional pixel defining layer can be omitted. As such the manufacturing process of the organic light emitting display device 20 can be simplified. In addition, the IGZO semiconductor layer 24 is used to replace the amorphous silicon used in the conventional organic light emitting display device. Consequently, an additional light shading layer can be omitted, and thus the manufacturing process of the organic light emitting display device 20 can be further simplified and productive efficiency of the organic light emitting display device 20 can be improved effectively.

Figure 3A:
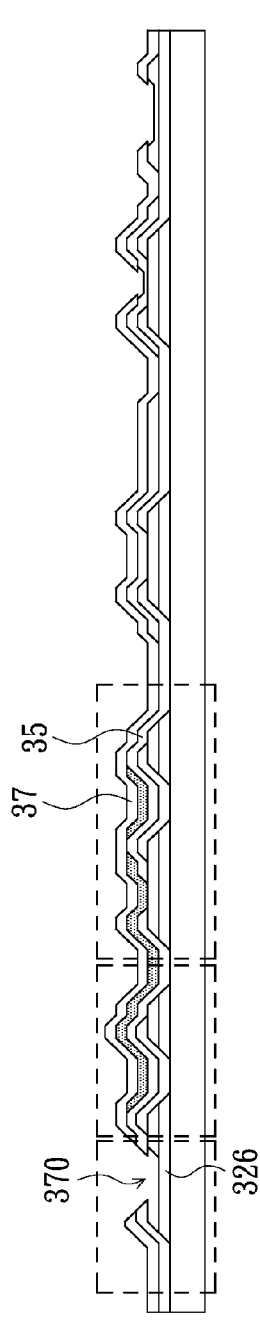
FIGS. 3A-3B are cross-sectional, schematic views of an organic light emitting display device in some steps of manufacturing process according to another exemplary embodiment of the present invention.
Figure 3B:
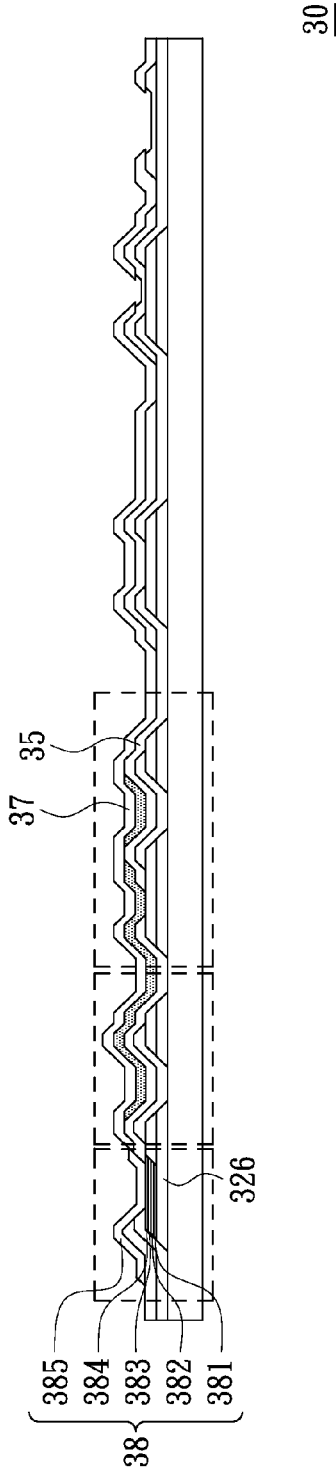

It should be pointed out that, in the method for manufacturing the organic light emitting display device 20, the opening 270 formed by etching the first insulating layer 25 and the second insulating layer 27 completely exposes an end of the third electrode 226 away from the second electrode 224, and the present invention is not limited herein. For example, referring to FIGS. 3A and 3B, in another embodiment, after a second insulating layer 37 is formed, an opening 370 is defined in a first insulating layer 35 and the second insulating layer 37 to expose a third electrode 326. Referring to FIG. 3B, next, an organic light emitting diode 38 is formed on the third electrode 326, and thus the organic light emitting display device 30 is formed. The organic light emitting diode 38 can include a hole injection layer 381, a hole transport layer 382, an organic light emitting layer 383, an electron injection layer 384 and a cathode reflective layer 385 sequentially formed on the third electrode 326. Two opposite ends of the hole injection layer 381, the hole transport layer 382, the organic light emitting layer 383 and the electron injection layer 384 are located under the second insulating layer 37 and the first insulating layer 35, and the cathode reflective layer 385 is located on the second insulating layer 37.

In summary, in the organic light emitting display device and the method for manufacturing the same, the organic light emitting diode is configured on a side of the thin film transistor, therefore some steps of using the mask can be reduced, and an additional pixel defining layer can be omitted. As such the manufacturing process of the organic light emitting display device can be simplified. In addition, the IGZO semiconductor layer is used to replace the amorphous silicon layer used in the conventional organic light emitting display device. Consequently, an additional light shading layer can be omitted, and thus the manufacturing process of the organic light emitting display device can be further simplified and productive efficiency of the organic light emitting display device can be improved effectively.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar diodes.

What is claimed is:

1. An organic fight emitting display device, comprising:
   a substrate having a first thin film transistor region, a second thin film transistor region and an organic fight emitting region, the second thin film transistor region located between the first thin film transistor region and the organic fight emitting region;
   a transparent electrode layer disposed on the substrate, and comprising a first electrode, a second electrode and a third electrode, the first electrode located above the first thin film transistor region, the second electrode located above the second thin film transistor region, the third electrode located above the organic fight emitting region and electrically connected with the second electrode;
   a source/drain layer disposed on the transparent electrode layer, and comprising a first drain and a second drain, the first drain located above the first thin film transistor region, the second drain located above the second thin film transistor region;
   an IGZO semiconductor layer disposed on the source/drain layer and the substrate, and comprising a first semiconductor and a second semiconductor, wherein the first semiconductor is located above the first thin film transistor region and directly in contact with the source/drain layer, and the second semiconductor is located above the second thin film transistor region and directly in contact with the source/drain layer;
   a first insulating layer disposed on the source/drain layer, the IGZO semiconductor layer and the substrate, and exposing the third electrode;
   a gate layer disposed on the first insulating layer, and comprising a first gate and a second gate, the first gate located above the first thin film transistor region, the second gate located above the second thin film transistor region, extended to above the first thin film transistor region and electrically connected with the first drain;
   a second insulating layer disposed on the first insulating layer and the gate layer, and exposing the third electrode; and
   an organic fight emitting diode disposed on the third electrode.

2. The organic light emitting display device according to claim 1, wherein material of the first insulating layer comprises silicon nitride, silicon oxide, aluminum oxide, yttrium oxide or any combination thereof.

3. The organic light emitting display device according to claim 1, wherein material of the gate layer comprises aluminum, aluminum neodymium alloy, molybdenum, chromium, molybdenum chromium alloy, copper or any combination thereof.

4. The organic light emitting display device according to claim 1, wherein material of the source/drain layer comprises aluminum, aluminum neodymium alloy, molybdenum, chromium, molybdenum chromium alloy, copper or combination thereof.

5. The organic light emitting display device according to claim 1, wherein material of the IGZO semiconductor layer comprises amorphous indium gallium zinc oxide.

6. The organic light emitting display device according to claim 1, wherein material of the second insulating layer comprises silicon nitride, silicon oxide, phenolic resin or polyimide, or second insulating layer is a composite insulation layer including organic materials and inorganic materials.

7. The organic light emitting display device according to claim 1, wherein material of the transparent electrode layer comprises indium tin oxide, indium zinc oxide, molybdenum, chromium, molybdenum chromium alloy or combination thereof.

8. The organic light emitting display device according to claim 1, wherein the organic light emitting diode comprises a hole injection layer, a hole transport layer, an organic light emitting layer, an electron injection layer and a cathode reflective layer sequentially formed on the third electrode.

9. The organic light emitting display device according to claim 8, wherein two opposite ends of the hole injection layer, the hole transport layer, the organic light emitting layer and the electron injection layer are located under the second insulating layer and the first insulating layer, and the cathode reflective layer is located on the second insulating layer.

* * * * *